(12) United States Patent
Tomita et al.

(10) Patent No.: US 10,121,956 B2
(45) Date of Patent: Nov. 6, 2018

(54) ELECTROACOUSTIC TRANSDUCER

(71) Applicant: TAIYO YUDEN CO., LTD., Taito-ku, Tokyo (JP)

(72) Inventors: Takashi Tomita, Takasaki (JP); Shigeo Ishii, Takasaki (JP); Hiroshi Hamada, Takasaki (JP); Yutaka Doshida, Takasaki (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 15/514,793

(22) PCT Filed: Aug. 31, 2015

(86) PCT No.: PCT/JP2015/074559
§ 371 (c)(1),
(2) Date: Mar. 27, 2017

(87) PCT Pub. No.: WO2016/063628
PCT Pub. Date: Apr. 28, 2016

(65) Prior Publication Data
US 2017/0222118 A1 Aug. 3, 2017

(30) Foreign Application Priority Data

Oct. 24, 2014 (JP) ................................. 2014-217703
May 25, 2015 (JP) ................................. 2015-105778

(51) Int. Cl.
*H01L 41/047* (2006.01)
*H01L 41/293* (2013.01)
(Continued)

(52) U.S. Cl.
CPC ........ *H01L 41/0471* (2013.01); *B06B 1/0611* (2013.01); *H01L 41/0831* (2013.01);
(Continued)

(58) Field of Classification Search
USPC ......................................................... 381/190
See application file for complete search history.

(56) References Cited

U.S. PATENT DOCUMENTS 5,142,511 A * 8/1992 Kanai .................... B06B 1/0625
  310/358
5,936,327 A * 8/1999 Takahashi ........... H01L 41/0474
  310/358

(Continued)

FOREIGN PATENT DOCUMENTS

JP    H11355892 A   12/1999
JP    2001016691 A   1/2001
(Continued)

OTHER PUBLICATIONS

International Search Report (ISR) dated Sep. 29, 2015, issued for International application No. PCT/JP2015/074559.

*Primary Examiner* — Oyesola C Ojo
(74) *Attorney, Agent, or Firm* — Law Office of Katsuhiro Arai

(57) ABSTRACT

An electroacoustic transducer includes: a polygonal-shaped laminated piezoelectric element including alternately stacked piezoelectric layers and electrode layers, with the piezoelectric layers placed between at least one pair of electrode layers having different polarities; and a circular vibration plate on which the laminated piezoelectric element is placed. Of the piezoelectric layers sandwiched between the at least one pair of electrode layers, the total volume (V) of those effective layers that overlap the at least one pair of electrode layers as viewed from the stacking direction satisfies the condition below:

$$0.2\pi R^2 \times ts \leq V \leq 2.0\pi R^2 \times ts$$

(Continued)

wherein π represents the ratio of the circumference of a circle to its diameter, R represents the radius of the vibration plate, and ts represents the thickness of the vibration plate.

9 Claims, 7 Drawing Sheets

(51) Int. Cl.
    H04R 7/04        (2006.01)
    H04R 17/00       (2006.01)
    H01L 41/083      (2006.01)
    H01L 41/113      (2006.01)
    H01L 41/297      (2013.01)
    B06B 1/06        (2006.01)

(52) U.S. Cl.
    CPC ........ H01L 41/1132 (2013.01); H01L 41/293 (2013.01); H01L 41/297 (2013.01); H04R 7/04 (2013.01); H04R 17/00 (2013.01)

(56) References Cited

U.S. PATENT DOCUMENTS

| | | | | |
|---|---|---|---|---|
| 6,291,932 B1* | 9/2001 | Maruyama | ......... | H01L 41/0474 310/328 |
| 6,437,484 B1* | 8/2002 | Nishimura | ......... | H03H 9/0509 310/324 |
| 6,744,180 B2* | 6/2004 | Nakamura | ......... | H04R 17/00 310/324 |
| 7,447,324 B2* | 11/2008 | Ogawa | ......... | B06B 1/0611 367/140 |
| 8,148,876 B2* | 4/2012 | Onishi | ......... | H04R 17/00 310/324 |
| 9,437,802 B2* | 9/2016 | Li | ......... | H01L 41/0471 |
| 9,820,055 B2* | 11/2017 | Babayoff | ......... | H04R 17/00 |
| 2001/0004180 A1* | 6/2001 | Kishimoto | ......... | H04R 1/06 310/324 |
| 2002/0130589 A1* | 9/2002 | Hamada | ......... | H04R 17/00 310/324 |
| 2003/0202672 A1* | 10/2003 | Yamauchi | ......... | H04R 1/06 381/190 |
| 2004/0201326 A1* | 10/2004 | Yokoi | ......... | H04R 17/00 310/348 |
| 2005/0248235 A1* | 11/2005 | Namerikawa | ....... | H01L 41/0831 310/328 |
| 2006/0028097 A1* | 2/2006 | Sashida | ......... | H04R 17/00 310/328 |
| 2010/0038998 A1* | 2/2010 | Onishi | ......... | H04R 17/00 310/334 |
| 2012/0235539 A1* | 9/2012 | Bibl | ......... | B06B 1/0644 310/316.01 |
| 2012/0299439 A1* | 11/2012 | Huang | ......... | B06B 1/0292 310/309 |
| 2014/0241550 A1* | 8/2014 | Sunahara | ......... | H04R 17/00 381/190 |
| 2015/0054387 A1* | 2/2015 | Li | ......... | H01L 41/0471 310/363 |

FOREIGN PATENT DOCUMENTS

| | | |
|---|---|---|
| JP | 2001238291 A | 8/2001 |
| JP | WO2013021906 A1 | 2/2013 |
| JP | 5304252 B2 | 7/2013 |
| WO | 2008084806 A1 | 7/2008 |

\* cited by examiner

[FIG. 1]
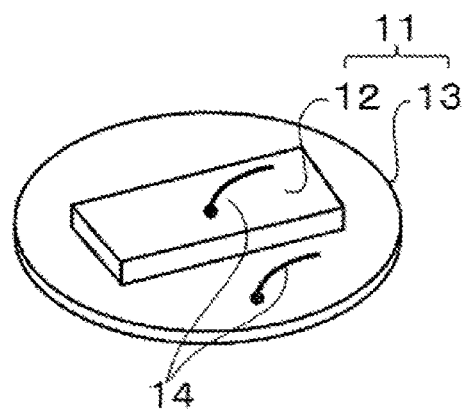
[FIG. 2]
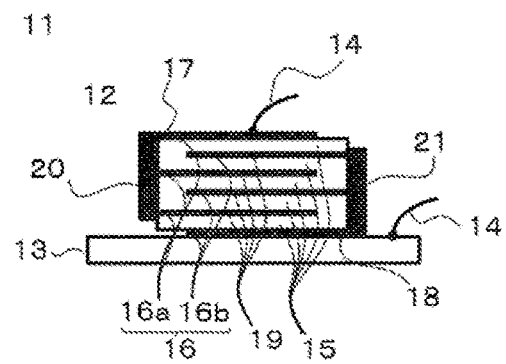
[FIG. 3]
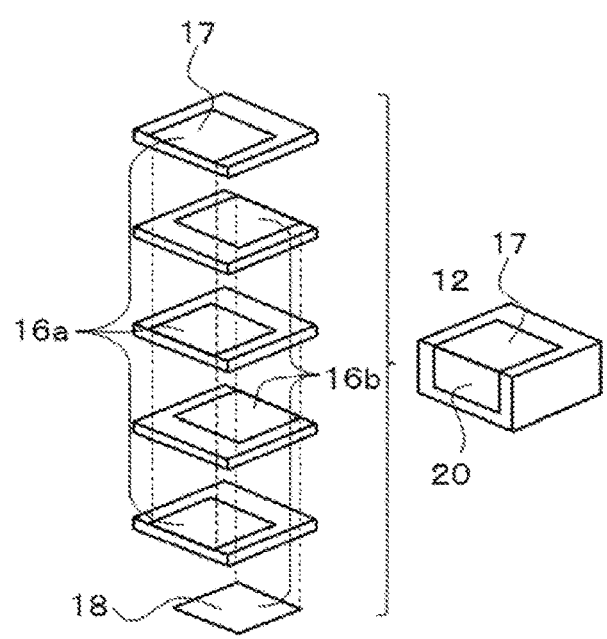

[FIG. 4]
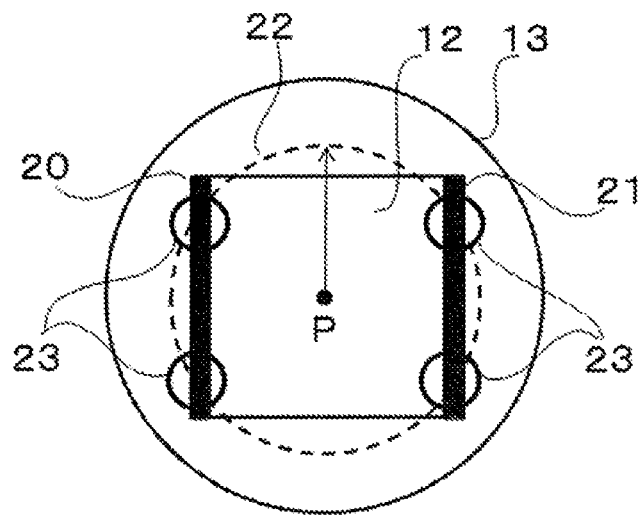
[FIG. 5]
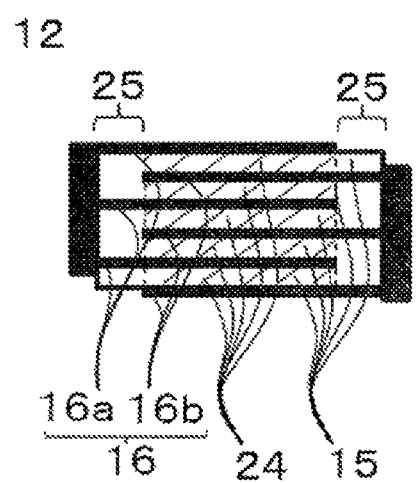
[FIG. 6]
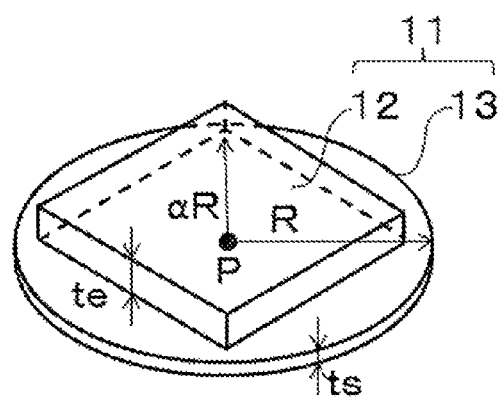

[FIG. 7]
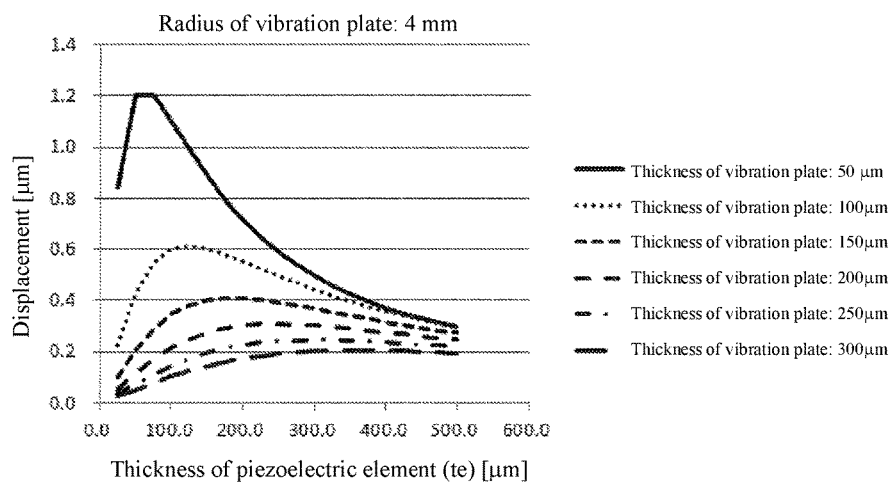
[FIG. 8]
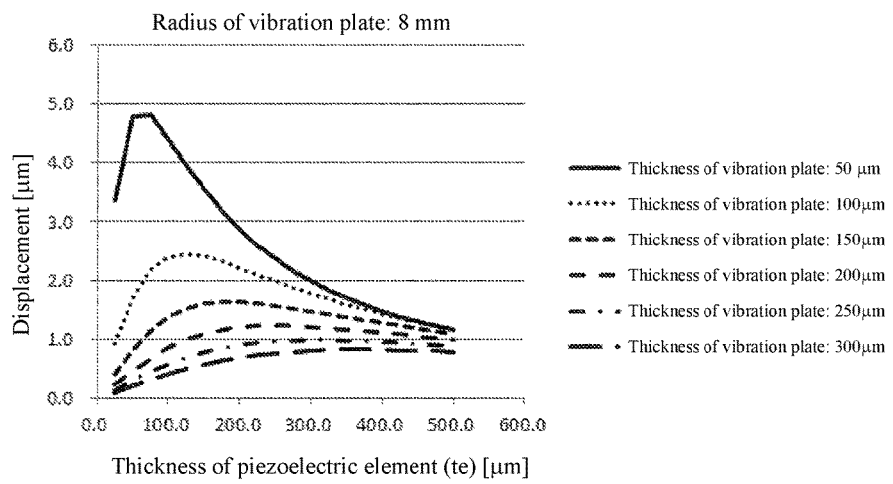

[FIG. 9]
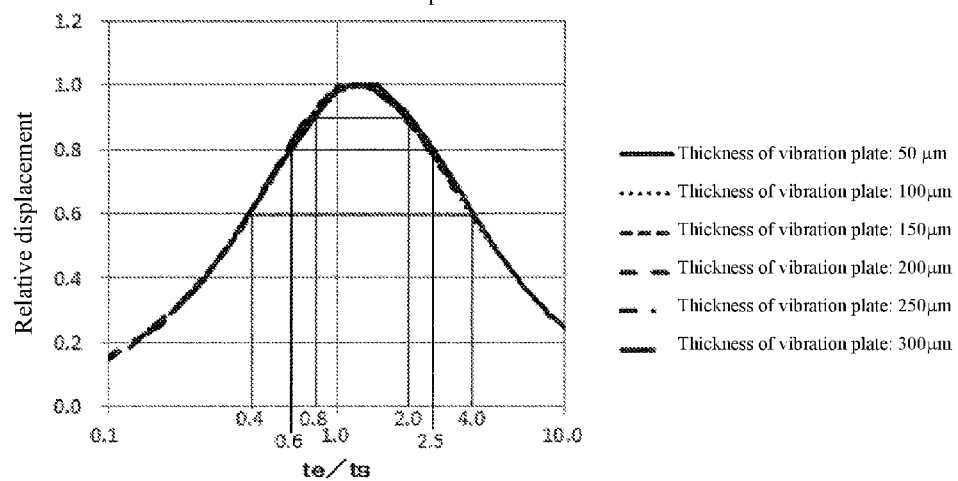
[FIG. 10]
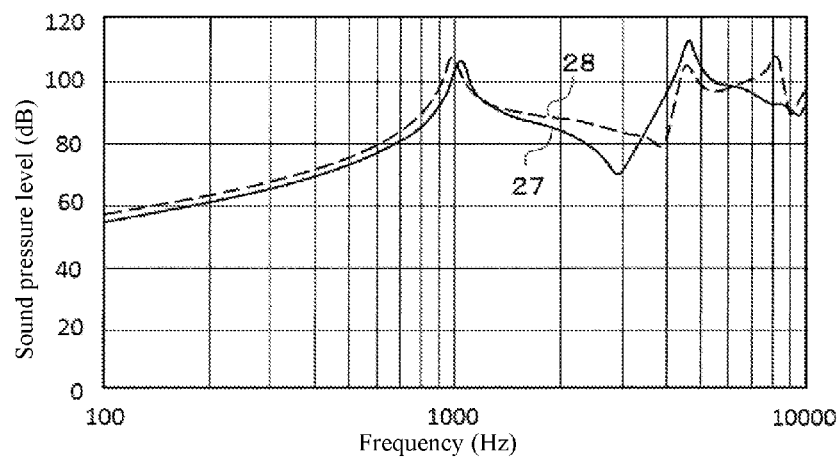

[FIG. 11]
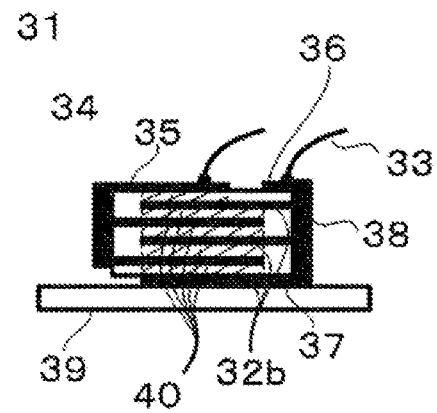
[FIG. 12]
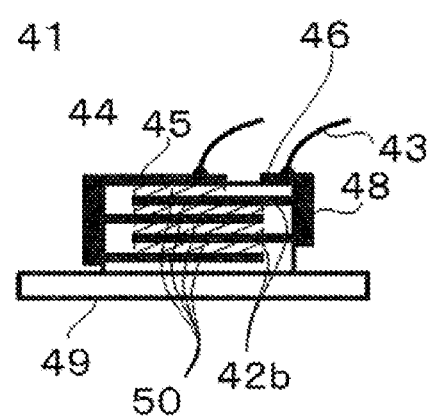
[FIG. 13]
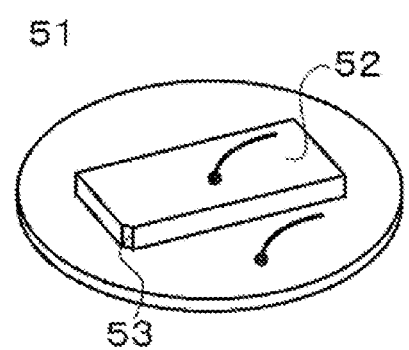

[FIG. 14]
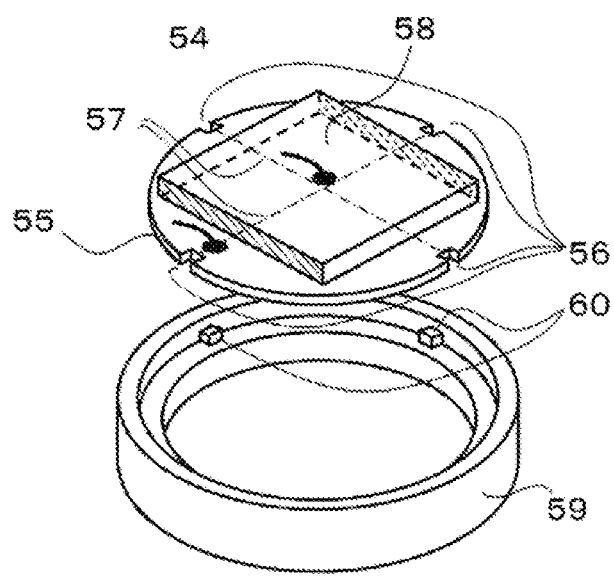
[FIG. 15]
Background Art
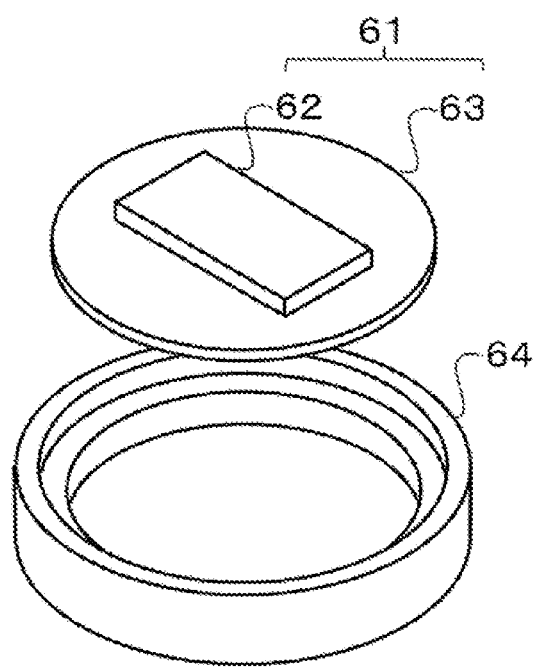

[FIG. 16]
Background Art
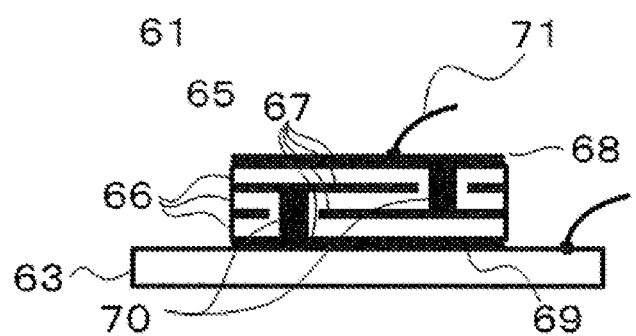

ELECTROACOUSTIC TRANSDUCER

This application is the U.S. National Phase under 35 U.S.C. § 371 of International Application PCT/JP2015/074559, filed Aug. 31, 2015, which claims priority to Japanese Patent Application No. 2014-217703, filed Oct. 24, 2014, and No. 2015-105778, filed May 25, 2015. The International Application was published under PCT Article 21(2) in a language other than English.

TECHNICAL FIELD

The present invention relates to an electroacoustic transducer, etc., having a polygonal laminated piezoelectric element and a circular vibration plate.

BACKGROUND ART

Electroacoustic transducers of the type having a laminated piezoelectric element and a vibration plate on which the laminated piezoelectric element is placed, are well-known. The laminated piezoelectric element deforms according to electrical signals, and this deformation causes the vibration plate to vibrate and the electroacoustic transducer generates audible waves.

In many cases the combined laminated piezoelectric element and vibration plate have similar shapes, such as both shaped like a circle or both shaped like a rectangle. When they have similar shapes, the laminated piezoelectric element and vibration plate can contact each other over a larger area, and consequently the sound pressures of the electroacoustic transducer can be increased.

On the other hand, the vibration plate is oftentimes circular in shape. This is because a rectangular vibration plate may give inconsistent deformation when it vibrates and the sound quality tends to drop as a result. On the other hand, a polygonal laminated piezoelectric element demonstrates excellent material yield, and is therefore more cost-effective, compared to a circular laminated piezoelectric element because piezoelectric materials are expensive. However, it is extremely rare that a polygonal laminated piezoelectric element is combined with a circular vibration plate.

FIG. 15 shows the piezoelectric acoustic component 61 described in Patent Literature 1, which is one of a few examples of prior art. The piezoelectric acoustic component 61 has a rectangular piezoelectric plate 62, and a disk-shaped metal plate 63 on which the piezoelectric plate 62 is placed. The piezoelectric acoustic component 61 fits into a ring-shaped case 64 having a concentric step on the inner periphery side, which is then embedded into a mobile phone, headphone, other mobile acoustic device, and the like.

For the piezoelectric plate 62, a laminated piezoelectric element is used. FIG. 16 shows the internal structure of the laminated piezoelectric element 65 described in Patent Literature 2. The laminated piezoelectric element 65 comprises piezoelectric layers 66 and electrode layers 67 that are stacked alternately. The electrode layers 67 include a first surface electrode layer 68 formed on the first surface of the laminated piezoelectric element 65 on the side opposite the one contacting the metal plate 63, and a second surface electrode layer 69 formed on the second surface on the side opposite the first surface (side contacting the metal plate 63). The electrode layers 67, including the first surface electrode layer 68 and second surface electrode layer 69, are connected alternately to one of a pair of connection electrodes 70 having different polarities. There are an odd number of piezoelectric layers 66, and the first surface electrode layer 68 and second surface electrode layer 69 are connected to the pair of connection electrodes 70 having different polarities, respectively. The connection electrodes 70 are formed by through holes. A lead wire 71 is soldered to the first surface electrode layer 68. The laminated piezoelectric element 65 is placed on the disk-shaped metal plate 63 with its second surface making contact, and the second surface electrode layer 69 and metal plate 63 are connected to each other electrically. Electrical signals are applied to the laminated piezoelectric element 65 via the lead wire 71 and metal plate 63. The laminated piezoelectric element 65 deforms and this deformation causes the vibration plate 63 to vibrate, and the electroacoustic transducer 61 generates audible waves.

BACKGROUND ART LITERATURE

Patent Literature

Patent Literature 1: Japanese Patent Laid-open No. Hei 11-355892
Patent Literature 2: Japanese Patent Laid-open No. 2001-016691

SUMMARY OF THE INVENTION

Problems to Be Solved by the Invention

When a polygonal laminated piezoelectric element is placed on a circular vibration plate, the laminated piezoelectric element and the vibration plate contact each other over a smaller area compared to when the combined laminated piezoelectric element and vibration plate have similar shapes. This reduces the power of the laminated piezoelectric element to vibrate the vibration plate, and the sound pressures decrease as a result.

The present invention was developed in light of the aforementioned situation, and its object is to provide an electroacoustic transducer capable of achieving sound pressures equivalent to those expected from a circular laminated piezoelectric element, even when a polygonal laminated piezoelectric element is used.

Means for Solving the Problems (1) An embodiment of the present invention relates to an electroacoustic transducer, comprising:
a laminated piezoelectric element comprising alternately stacked piezoelectric layers and electrode layers, with the piezoelectric layers placed between at least one pair of electrode layers having different polarities; and
a vibration plate on which the laminated piezoelectric element is placed;
which is characterized in that:
the laminated piezoelectric element is polygonal in shape when viewed from the stacking direction;
the vibration plate on which the laminated piezoelectric element is placed is circular in shape; and
of the piezoelectric layers sandwiched between the at least one pair of electrode layers, the total volume (V) of those effective layers that overlap with the at least one pair of electrode layers when projected from the stacking direction satisfies the condition below:

$$0.2\pi R^2 \times ts \leq V \leq 2.0\pi R^2 \times ts$$

(Note that π represents the ratio of the circumference of a circle to its diameter, R represents the radius of the vibration plate, and ts represents the thickness of the vibration plate.)

With the laminated piezoelectric element, deformation occurs in its effective layers that correspond to, of the piezoelectric layers sandwiched between the pair of electrode layers having different polarities, the parts that overlap with the two electrode layers having different polarities as viewed from the stacking direction. This deformation is transmitted to the vibration plate, and the electroacoustic transducer generates audible waves. According to an embodiment of the present invention, where the total volume (V) of the effective layers satisfies the aforementioned formula, the power of the laminated piezoelectric element to vibrate the vibration plate becomes sufficiently large, and consequently sound pressures equivalent to those expected from a circular laminated piezoelectric element can be achieved even when a polygonal laminated piezoelectric element is used.

(2) In an embodiment of the present invention, preferably the at least one pair of electrode layers include a first electrode layer and a second electrode layer having different polarities, wherein the first electrode layer is connected to a first side electrode formed on one side face of the laminated piezoelectric element, while the second electrode layer is connected to a second side electrode formed on a side face different from the one on which the first side electrode is formed.

With a circular vibration plate, a specific region, especially a region of a concentric circle drawn at a specific distance from the center of the vibration plate, may undergo greater deformation due to first-order resonance, etc. Any connection electrode that interconnects electrode layers in this region may break due to concentration of stress from deformation. However, the side electrodes have varying distances from the center of the circular vibration plate, so even if any side electrode breaks in a specific region, its connection is maintained in other regions. Accordingly, it is expected that stable sound pressures and sound quality will be maintained.

(3) In an embodiment of the present invention, preferably the first electrode layer includes an electrode layer formed on the surface of the laminated piezoelectric element on the side opposite the one that contacts the vibration plate.

Since the electrode layers are interconnected by side electrodes, not by through holes, stress does not remain in the laminated piezoelectric element. This means that, even when a lead wire is soldered to the electrode layer formed on the surface of the laminated piezoelectric element on the side opposite the one that contacts the vibration plate, the laminated piezoelectric element can be prevented from being damaged due to thermal shock.

(4) In an embodiment of the present invention, preferably the laminated piezoelectric element is square in shape when viewed from the stacking direction. Since the shape symmetry of the laminated piezoelectric element becomes closer to that of a circle, the sound quality becomes closer to that achieved by a circular laminated piezoelectric element.

BRIEF DESCRIPTION OF THE DRAWINGS

FIG. 1 Appearance of the electroacoustic transducer pertaining to the first embodiment.

FIG. 2 Internal structure of the electroacoustic transducer pertaining to the first embodiment.

FIG. 3 Stacking and appearance of the laminated piezoelectric element in the first embodiment.

FIG. 4 Connection stability of the side electrodes in the first embodiment.

FIG. 5 Effective layers of the laminated piezoelectric element in the first embodiment.

FIG. 6 Dimensions of the circular vibration plate and polygonal laminated piezoelectric element of the electroacoustic transducer pertaining to the first embodiment.

FIG. 7 How the displacement amount of the center of the vibration plate changes when the thickness of the vibration plate and the effective layer thickness of the laminated piezoelectric element are varied, in a case where the radius of the vibration plate is 4 mm.

FIG. 8 How the displacement amount of the center of the vibration plate changes when the thickness of the vibration plate and the effective layer thickness of the laminated piezoelectric element are varied, in a case where the radius of the vibration plate is 8 mm.

FIG. 9 How the amount of relative displacement of the center of the vibration plate changes when the thickness of the vibration plate and the effective layer thickness of the laminated piezoelectric element are varied, in a case where the radius of the vibration plate is 4 mm.

FIG. 10 Comparison between the sound pressure characteristics of the electroacoustic transducer with a square laminated piezoelectric element pertaining to the first embodiment, and the sound pressure characteristics of an electroacoustic transducer with a circular laminated piezoelectric element.

FIG. 11 Internal structure of the electroacoustic transducer pertaining to the second embodiment.

FIG. 12 Internal structure of the electroacoustic transducer pertaining to the third embodiment.

FIG. 13 Appearance of the electroacoustic transducer pertaining to the fourth embodiment.

FIG. 14 Appearance of the electroacoustic transducer pertaining to the fifth embodiment.

FIG. 15 Appearance of a conventional piezoelectric acoustic component.

FIG. 16 Internal structure of a conventional laminated piezoelectric element.

MODE FOR CARRYING OUT THE INVENTION

Embodiments of the present invention are explained below by referring to the attached drawings. It should be noted that the embodiments explained below do not unduly limit the content of the present invention as described in "What Is Claimed Is," and that not all of the constitutions explained in the embodiments are required as means for solving the problems under the present invention.

Under the present invention, the shape of the laminated piezoelectric element and that of the vibration plate are expressed by the shape of the laminated piezoelectric element, and by the shape of the vibration plate on the side where the laminated piezoelectric element is placed, respectively, as viewed from the stacking direction. For example, with the phrase "circular laminated piezoelectric element," the "circular" shape recognized when viewed from the stacking direction is used for the sake of convenience, although the laminated piezoelectric element actually has a cylindrical shape. With the phrase "polygonal laminated piezoelectric element," the "polygonal" shape recognized when viewed from the stacking direction is used for the sake of convenience, although the polygonal laminated piezoelectric element actually has a polygonal prism shape. With the phrase "circular vibration plate," the "circular" shape of the side on which the laminated piezoelectric element is placed is used for the sake of convenience, although the vibration plate actually has a cylindrical shape.

First Embodiment

FIG. 1 shows the appearance of the electroacoustic transducer 11 pertaining to the first embodiment of the present invention. The electroacoustic transducer 11 has a polygonal laminated piezoelectric element 12, and a circular vibration plate 13 on which the laminated piezoelectric element 12 is placed. The electroacoustic transducer 11 shown in FIG. 1 has its laminated piezoelectric element 12 placed on one side of the vibration plate 13; however, it may have laminated piezoelectric elements 12 placed on both sides of the vibration plate 13.

The shape of the laminated piezoelectric element 12 may be quadrangle, diamond, trapezoid, square, rectangle or hexagon. Here, "square" refers to a shape that satisfies |a−b|/a≤10%, where a and b represent the lengths of two sides that intersect at right angles to each other. When this relationship formula is satisfied, the sound pressures and sound quality virtually no longer drop. If the shape of the laminated piezoelectric element is one of polygons (such as rectangle) excluding regular polygons (such as square, regular hexagon, etc.), the orientation of the laminated piezoelectric element 12 can be determined. Operations such as placing the laminated piezoelectric element 12 on the vibration plate 13 and forming of electrodes on the laminated piezoelectric element 12 can be performed in a reliable manner, and any variation in sound quality among electroacoustic transducers 11 is minimized.

The dimension (maximum length) of the laminated piezoelectric element 12 is in a range of 5.4 to 108 mm, for example. If this dimension is too small, production becomes difficult; as the dimension increases, on the other hand, the laminated piezoelectric element 12 becomes more vulnerable to cracks. The thickness of the laminated piezoelectric element is in a range of 0.03 to 0.2 mm (30 to 0.200 μm), for example. If the thickness is too small, production becomes difficult; as the thickness increases, on the other hand, deformation of the laminated piezoelectric element 12 is inhibited.

The radius of the vibration plate 13 is in a range of 3 to 60 mm, for example. If the radius is too small, production becomes difficult; as the radius increases, on the other hand, the laminated piezoelectric element 12 becomes more vulnerable to cracks. The thickness of the vibration plate 13 is preferably in a range of 0.05 to 0.5 mm, or more preferably in a range of 0.05 to 0.3 mm. If the vibration plate is too thin, its strength decreases; as its thickness increases, on the other hand, vibration is inhibited. For the vibration plate 13, a metal may be used. Examples of the metal include stainless steel (SUS) and 42 alloy. In this embodiment, 42 alloy was used and the radius and thickness of the vibration plate 13 were adjusted to 5.55 mm and 200 μm, respectively.

Lead wires 14 are soldered to the first surface of the laminated piezoelectric element 12 on the side opposite the one that contacts the vibration plate 13, and also to the side of the vibration plate 13 on which the laminated piezoelectric element 12 is placed but in a region not contacting the laminated piezoelectric element 12. Since the laminated piezoelectric element 12 is polygonal, the region of the vibration plate 13 not contacting the laminated piezoelectric element 12 is larger than when the laminated piezoelectric element 12 is circular. This makes it easy to solder the lead wire 14 to the vibration plate 13. Since the vibration plate 13 is made of metal, electrical signals are applied to the laminated piezoelectric element 12 via the lead wires 14 and vibration plate 13. The laminated piezoelectric element 12 deforms, this deformation causes the vibration plate 13 to vibrate, and the electroacoustic transducer 11 generates audible waves.

FIG. 2 shows the internal structure of the electroacoustic transducer 11 pertaining to the first embodiment. The laminated piezoelectric element 12 comprises piezoelectric layers 15 and electrode layers 16 that are stacked alternately. For the piezoelectric layers 15, lead zirconate titanate (PZT), barium titanate, alkali-containing perovskite, tungsten bronze, or other strong dielectric material may be used. For the electrode layers 16, Ag/Pd, Pd, etc., may be used. The electrode layers 16 have a thickness in a range of 1 to 5 μm. If the electrode layers 16 are too thin, they tend to become discontinuous; if they are too thick, on the other hand, deformation of the laminated piezoelectric element 12 is inhibited. In this embodiment, PZT was used for the piezoelectric layers 15, while Ag/Pd was used for the electrode layers 16, and the electrode layers 16 were formed to have a thickness of 2 μm after sintering.

The electrode layers 16 include a first surface electrode layer 17 formed on the first surface of the laminated piezoelectric element 12 on the side opposite the one that contacts the vibration plate 13, a second surface electrode layer 18 formed on the second surface of the laminated piezoelectric element 12 on the side that contacts the vibration plate 13, and internal electrode layers 19 formed inside the laminated piezoelectric element 12. Also, the electrode layers 16 are made up of two types of electrode layers having different polarities, respectively referred to as "first electrode layers 16a" and "second electrode layers 16b." The first electrode layers 16a and second electrode layers 16b are placed alternately. The piezoelectric layers 15 are sandwiched between the first electrode layers 16a and second electrode layers 16b.

The number of piezoelectric layers 15 is in a range of 2 to 10; however, an odd number of 3 or more is preferred as this makes it easier to place the electrode layers 16. This is because the first and second surface electrode layers 17, 18 can be formed as first and second electrode layers 16a, 16b, respectively. In this embodiment, the number of piezoelectric layers 15 was set to 5.

Interconnection of electrode layers is explained by also referring to FIG. 3. The first electrode layers 16a (including the first surface electrode layer 17) are led out to one side face of the laminated piezoelectric element 12. The first electrode layers 16a (including the first surface electrode layer 17) are connected to a first side electrode 20 formed on the side face to which they are led out. The second electrode layers 16b (including the second surface electrode layer 18) are led out to a side face different from the one on which the first side electrode is formed, such as the side face opposite the one on which the first side electrode is formed. The second electrode layers 16b (including the second surface electrode layer 18) are connected to a second side electrode 21 formed on the side face to which they are led out. The first and second side electrodes 20, 21 are formed according to any known method. For example, the dip method or sputtering method may be used. In this embodiment, the sputtering method was used.

When the laminated piezoelectric element 12 is placed on the vibration plate 13, the second surface electrode layer 18 contacts the vibration plate 13. Since the vibration plate 13 is made of metal, the two are connected electrically. The laminated piezoelectric element 12 may be fixed using any known method. Even when resin adhesive or other insulating adhesive is used, for example, the second surface electrode layer 18, which has fine surface irregularities, is still connected to the vibration plate 13 electrically when pressed against it.

Lead wires 14 are soldered to the first surface electrode layer 17 of the laminated piezoelectric element 12, and also to the side of the vibration plate 13 on which the laminated piezoelectric element 12 is placed, but in a region not contacting the laminated piezoelectric element 12. Electrical signals are applied to the laminated piezoelectric element 12 via the lead wires 14 and vibration plate 13. The laminated piezoelectric element 12 deforms, this deformation causes the vibration plate 13 to vibrate, and the electroacoustic transducer 11 generates audible waves.

Since the electrode layers 16 are interconnected by the side electrodes 20, 21, not by through holes, stress does not remain in the laminated piezoelectric element 12. This means that, even when a lead wire 14 is soldered to the first surface electrode layer 17, the laminated piezoelectric element 12 can be prevented from being damaged due to thermal shock.

Also, the polygonal laminated piezoelectric element 12 undergoes large deformation at the center, and the deformation decreases toward the apexes of the polygon. As a result, the circular vibration plate 13 also has a high amplitude at the center, and the amplitude decreases toward the outer periphery. However, the amplitude of the circular vibration plate 13 may increase in a specific region, such as the region 22 of a concentric circle drawn at a specific distance from the center P of the vibration plate 13 as shown by the broken line in FIG. 4, due to first-order resonance, etc. Any connection electrode that interconnects electrode layers in this region may break due to concentration of stress as a result of this increased amplitude. In other words, the first and second side electrodes 20, 21 may break in the regions 23 overlapping the region 22 of the concentric circle drawn from the center P of the vibration plate 13. However, the first and second side electrodes 20, 21 have varying distances from the center P of the circular vibration plate 13, so even if any of these regions 23 breaks, their connection is maintained in other regions. Accordingly, stable sound pressures and sound quality will be maintained.

FIG. 5 shows the parts of the laminated piezoelectric element 12 that deform when electrical signals are applied in the first embodiment. With the laminated piezoelectric element 12, deformation occurs in its effective layers 24 that correspond to, of the piezoelectric layers 15 sandwiched between the two electrode layers having different polarities (first electrode layer 16a and second electrode layer 16b), the parts that overlap the first electrode layers 16a and second electrode layers 16b having different polarities (shaded parts in FIG. 5) as viewed from the stacking direction. The deformation of the effective layers 24 causes the vibration plate to vibrate, and the electroacoustic transducer generates audible waves.

The laminated piezoelectric element 12 has, besides the effective layers 24, margins 25 (piezoelectric layers not overlapped by the electrodes of different polarities) of approx. 100 μm in width around the effective layers 24, and electrode layers 16; however, they virtually have no impact on the sound pressures because their volumes are small compared to the effective layers 24. When the total volume of effective layers 24 is given by V, V can be estimated by measuring the dimensions of the laminated piezoelectric element.

The inventor of the present invention found that, when the radius of a circular vibration plate 13 is given by R and the thickness of the vibration plate 13 is given by ts, as shown in FIG. 6, a polygonal laminated piezoelectric element 12 would achieve sound pressures equivalent to those of a circular laminated piezoelectric element so long as the total volume of its effective layers (V) satisfies the conditional formula (Formula 1) below:

$$0.2\pi R^2 \times ts \leq V \leq 2.0\pi R^2 \times ts \quad \text{(Formula 1)}$$

(Note that π represents the ratio of the circumference of a circle to its diameter, R represents the radius of the vibration plate, and ts represents the thickness of the vibration plate.)

The process of deriving (Formula 1) is described below.

When the radius of a circular vibration plate 13 is given by R, the thickness of the vibration plate 13 is given by ts, one-half of the length of the diagonal line of the effective layer of a polygonal laminated piezoelectric element 12 is given by αR, and the effective layer thickness of the laminated piezoelectric element 12 is given by te, then the total volume (V) of the effective layers of the polygonal laminated piezoelectric element 12 is calculated as follows:

$$V = ((2\alpha R)/(2^{0.5}))^2 \times te \quad \text{(Formula 2)}$$

Preferably α is 0.9. This is because, while a larger α increases the area over which the laminated piezoelectric element 12 and vibration plate 13 contact each other and the sound pressures of the electroacoustic transducer 11 increase as a result, margins are needed to place the polygonal laminated piezoelectric element 12 on the circular vibration plate 13. When α=0.9 is applied to (Formula 2), the following formula is obtained:

$$V = 1.6 R^2 \times te \quad \text{(Formula 3)}$$

Here, the displacement amount of the center P of the vibration plate 13 was evaluated based on the analysis conditions below:

Restrained parts: Edge side faces of the circular vibration plate 13

Applied voltage: 1 VDC/10 μm in the thickness direction of the laminated piezoelectric element 12 (at constant electric field intensity)

FIGS. 7 and 8 show how the displacement amount of the center P of the vibration plate 13 changes when the thickness (ts) of the vibration plate 13 and the effective layer thickness (te) of the laminated piezoelectric element 12 are varied, in cases where the radius (R) of the vibration plate 13 is 4 mm and 8 mm, respectively. It is shown that, when the thickness (ts) of the vibration plate 13 is fixed (to ts=100 μm, for example), the displacement amount of the center P of the vibration plate 13 becomes the maximum if the effective layer thickness (te) of the laminated piezoelectric element 12 is equal to or slightly larger than the thickness (ts) of the vibration plate 13, regardless of the size of the vibration plate 13.

FIG. 9 is the same as the case in FIG. 7 where the radius (R) of the vibration plate 13 is 4 mm, except that the x-axis has been converted to the relative thickness of the effective layers of the laminated piezoelectric element 12 to the thickness (ts) of the vibration plate 13 (te/ts) and that the y-axis has been converted to the relative displacement amount of the center of the vibration plate to the maximum displacement amount of the center of the vibration plate at each vibration plate thickness. It should be noted, in cases where the radius (R) of the vibration plate 13 is other than 4 mm (such as when R=8 mm as shown in FIG. 8), similar conversions also yield results similar to those shown in FIG. 9.

It is clear from FIG. 9 that, when "0.4≤te/ts≤4.0" is satisfied, the relative displacement amount of the vibration plate 13 is 0.6 or more, suggesting that sufficient sound pressures can be ensured. When this is applied to (Formula 3), "0.27πR²×ts≤V≤2.0πR²×tx" (Formula 1) is derived.

It is also clear from FIG. 9 that, when "0.6≤te/ts≤2.5" and "0.8≤te/ts≤2.0" are satisfied, the relative displacement amount of the vibration plate 13 is 0.8 or more and 0.9 or more, respectively, which is preferable from the viewpoint of ensuring sound pressures. When these are applied to (Formula 3), the following formulas are obtained:

$$0.3 \times \pi R^2 \times ts \leq V \leq 1.3 \times \pi R^2 \times ts \quad \text{(Formula 4)}$$

$$0.4 \times \pi R^2 \times ts \leq V \leq 1.0 \times \pi R^2 \times ts \quad \text{(Formula 5)}$$

Preferably the total volume (V) of the effective layers of the polygonal laminated piezoelectric element is 0.7 to 1830 mm³. In this embodiment, the effective layers of the laminated piezoelectric element were created so that their diagonal line would become 10 mm long (length 7.07 mm, width 7.07 mm) and their height would become 0.15 mm (150 μm) after sintering. The total volume (V) of effective layers is 7.5 mm³.

Since the radius (R) of the vibration plate 13 is 5.55 mm and its thickness (ts) is 200 μm, applying these to the left term and right term of (Formula 1) gives the following:

$$0.2\pi R^2 \times ts \text{ (left term of (Formula 1))} = 3.9 \text{ mm}^3$$

$$2.0\pi R^2 \times ts \text{ (right term of (Formula 1))} = 38.7 \text{ mm}^3$$

Since the total volume (V) of effective layers is 7.5 mm³, (Formula 1) is satisfied.

FIG. 10 shows a comparison of the sound pressure characteristics 27 of the electroacoustic transducer with a square laminated piezoelectric element in this embodiment, and the sound pressure characteristics 28 of an electroacoustic transducer with a circular laminated piezoelectric element (the radius of the laminated piezoelectric element is 0.9×R). The sound pressure characteristics 27 of the electroacoustic transducer in this embodiment exceed 100 dB at both the first peak at approx. 1000 Hz and second peak at approx. 4500 Hz. This shows that the electroacoustic transducer in this embodiment, which satisfies (Formula 1), demonstrates sound pressure characteristics equivalent to those of the electroacoustic transducer with a circular laminated piezoelectric element.

Second Embodiment

FIG. 11 shows the internal structure of the electroacoustic transducer 31 pertaining to the second embodiment. The second embodiment is different from the first embodiment in terms of how the lead wire 33, which connects electrically to the second electrode layers 32b, is connected. Since all other aspects are the same as those in the first embodiment, only this difference is explained.

A first surface electrode layer 35, and a third surface electrode 36 away from it, are formed on the first surface of the laminated piezoelectric element 34. The third surface electrode 36 and second electrode layers 32b (including the second surface electrode layer 37 formed on the side that contacts the vibration plate) are led out to the side face opposite the one to which the first surface electrode layer 35 is led out. The third surface electrode 36 and second electrode layers 32b (including the second surface electrode layer 37) are connected to the second side electrode 38 formed on the side face to which they are led out.

The lead wire 33 that connects electrically to the second electrode layers 32b (including the second surface electrode layer 37) is soldered to the third surface electrode 36 formed on the first surface of the laminated piezoelectric element 34. For this reason, the second surface electrode layer 37 formed on the second surface of the laminated piezoelectric element 34 need not be electrically continuous to the vibration plate 39. Accordingly, resin may be used for the vibration plate 39 in addition to metal as described in the first embodiment. Examples of the resin include PET and urethane.

The total volume (V) of the effective layers 40 (shaded parts in FIG. 11) in the second embodiment is 7.5 mm³, which satisfies (Formula 1).

Third Embodiment

FIG. 12 shows the internal structure of the electroacoustic transducer 41 pertaining to the third embodiment. The third embodiment is different from the first embodiment in terms of how the lead wire 43, which connects electrically to the second electrode layers 42b, is connected, and also in that no second surface electrode layer is formed on the second surface of the laminated piezoelectric element 44. Since all other aspects are the same as those in the first embodiment, only these differences are explained.

A first surface electrode layer 45, and a third surface electrode 46 away from it, are formed on the first surface of the laminated piezoelectric element 44. No second surface electrode layer is formed on the second surface of the laminated piezoelectric element 44 on the side that contacts the vibration plate. The third surface electrode 46 and second electrode layers 42b (no second surface electrode layer is formed) are led out to the side face opposite the one to which the first surface electrode layer 45 is led out. The third surface electrode 46 and second electrode layers 42b (no second surface electrode layer is formed) are connected to the second side electrode 48 formed on the side face to which they are led out.

The lead wire 43 that connects electrically to the second electrode layers 42b (no second surface electrode layer is formed) is soldered to the third surface electrode 46 formed on the first surface of the laminated piezoelectric element 44. For this reason, the second electrode layers 42b need not be electrically continuous to the vibration plate 49. Accordingly, resin may be used for the vibration plate 49 in addition to metal as described in the first embodiment. Examples of the resin include PET and urethane.

The total volume (V) of the effective layers 50 (shaded parts in FIG. 12) in the third embodiment is 6.0 mm³, which satisfies (Formula 1).

Fourth Embodiment

FIG. 13 shows the appearance of the electroacoustic transducer 51 pertaining to the fourth embodiment. In this embodiment, a cutout 53 is formed on at least one apex of the polygonal laminated piezoelectric element 52. If the laminated piezoelectric element 52 is rectangular in shape, a cutout 53 may be formed on at least one, but a maximum of three, of the four apexes.

As each cutout 53 serves as a reference point of the laminated piezoelectric element 52, operations such as forming side electrodes at specified positions and placing the laminated piezoelectric element 52 at a specified position on a circular vibration plate can be performed in a reliable manner. As a result, any variation in sound quality among electroacoustic transducers is minimized. The cutout 53 can have any shape so long as it is identifiable. In this embodiment, it has a triangle shape.

Fifth Embodiment

FIG. 14 shows the appearance of the electroacoustic transducer 54 pertaining to the fifth embodiment. The circular vibration plate 55 has four polygonal cutouts 56 along its circumference. The straight lines 57, each connecting a pair of cutouts 56 that are not adjacent to each other, intersect at the center of the circular vibration plate 55. The straight lines may intersect at 90° or any other angle. The apexes of the polygon of the laminated piezoelectric element 58 are placed between the adjacent pairs of cutouts 56. As each cutout 56 serves as a reference point, the laminated piezoelectric element 58 can be positioned easily.

There is a support member 59 having four projections 60 on the step formed as a concentric circle (two of the projections 60 are hidden behind the step and not shown). The four projections 60 are formed at positions where they fit into the four polygonal cutouts 56. As the cutouts 56 and projections 60 fit into each other, the electroacoustic transducer 54 can be fixed on the support member 59 easily.

If the laminated piezoelectric element is circular in shape, the radius of the laminated piezoelectric element must be reduced to prevent the laminated piezoelectric element from covering the cutouts. The placement in this embodiment makes sure the apexes of the polygonal laminated piezoelectric element 58 do not cover the cutouts 56. Since the laminated piezoelectric element 58 can be placed without having to reduce its size, sound pressures can be maintained. It should be noted that the radius of the vibration plate 55 with the cutouts 56 is calculated based on a virtual circle without cutouts. If the vibration plate has projections formed on its outer periphery, the radius of the vibration plate is calculated based on a virtual circle without the projections.

The foregoing explained these embodiments in detail; however, it should be clear to those skilled in the art that the present invention permits many variations so long as they do not substantively deviate from the novel claims and effects thereof.

For example, the electroacoustic transducer 54 in FIG. 14 has a specific number of cutouts 56, or 4 to be exact; if there is at least one cutout, however, it can be used as a reference to allow for easy positioning of the electroacoustic transducer 54. Also, the shape of the cutout 56 is not limited specifically to polygonal, so long as it fits the projection. The shape of the cutout 56 may be a triangle, quadrangle, trapezoid, square, rectangle, pentagon, or other polygon, or arc, U-shape, or the like.

Also, the number of projections 60 of the support member 59, and their shape, are not limited in any way so long as they match the number of cutouts 56 and their shape. The shape of the projection 60 may be a triangle, quadrangle, trapezoid, square, rectangle, pentagon, or other polygon, or arc, U-shape, or the like. In other words, all these variation examples are included in the scope of the present invention.

DESCRIPTION OF THE SYMBOLS

11, 31, 41, 51, 54, 61 Electroacoustic transducer (piezoelectric acoustic component)
12, 34, 44, 52, 58, 62, 65 Laminated piezoelectric element (piezoelectric plate)
13, 39, 49, 55, 63 Vibration plate (metal plate)
14, 33, 43, 71 Lead wire
15, 66 Piezoelectric layer
16, 67 Electrode layer
16a First electrode layer
16b, 32b, 42b Second electrode layer
17, 35, 45, 68 First surface electrode layer
18, 37, 69 Second surface electrode layer
19 Internal electrode layer
20 First side electrode
21, 38, 48 Second side electrode
22 Region where the vibration plate deforms significantly
23 Region where side electrode damage may occur
24, 40, 50 Effective layer
25 Margin
27 Sound pressure characteristics of an electroacoustic transducer with a square laminated piezoelectric element
28 Sound pressure characteristics of an electroacoustic transducer with a circular laminated piezoelectric element
36, 46 Third surface electrode
53, 56 Cutout
57 Straight line connecting a pair of cutouts that are not adjacent to each other
59, 64 Support member (case)
60 Projection
70 Connection electrode (through hole)

What is claimed is:

1. An electroacoustic transducer, comprising:
   a laminated piezoelectric element comprising alternately stacked piezoelectric layers and electrode layers, with the piezoelectric layers placed between at least one pair of electrode layers having different polarities; and
   a vibration plate on which the laminated piezoelectric element is placed;
   said electroacoustic transducer is characterized in that:
   the laminated piezoelectric element is polygonal in shape when viewed from a stacking direction;
   the vibration plate on which the laminated piezoelectric element is placed is circular in shape and made of a metal; and
   of the piezoelectric layers sandwiched between the at least one pair of electrode layers, a total volume (V) of effective layers that overlap the at least one pair of electrode layers as viewed from the stacking direction satisfies a condition below when V is approximated by a volume of the laminated piezoelectric element:

$$0.2\pi R^2 \times ts \leq V \leq 2.0\pi R^2 \times ts$$

(wherein $\pi$ represents a ratio of a circumference of a circle to its diameter, R represents a radius of the vibration plate, and ts represents a thickness of the vibration plate).

2. The electroacoustic transducer according to claim 1, characterized in that:
   the at least one pair of electrode layers include a first electrode layer and a second electrode layer having different polarities;
   the first electrode layer is connected to a first side electrode formed on one side face of the laminated piezoelectric element; and
   the second electrode layer is connected to a second side electrode formed on a side face different from the one on which the first side electrode is formed.

3. The electroacoustic transducer according to claim 2, characterized in that the first electrode layer includes an electrode layer formed on a surface of the laminated piezoelectric element on a side opposite the one that contacts the vibration plate.

4. The electroacoustic transducer according to claim 1, characterized in that the laminated piezoelectric element is square in shape when viewed from the stacking direction.

5. The electroacoustic transducer according to claim 2, characterized in that the laminated piezoelectric element is square in shape when viewed from the stacking direction.

6. The electroacoustic transducer according to claim 3, characterized in that the laminated piezoelectric element is square in shape when viewed from the stacking direction.

7. The electroacoustic transducer according to claim 1, wherein the vibration plate has a thickness of 0.05-0.5 mm.

8. The electroacoustic transducer according to claim 2, wherein the vibration plate has a thickness of 0.05-0.5 mm.

9. The electroacoustic transducer according to claim 3, wherein the vibration plate has a thickness of 0.05-0.5 mm.

* * * * *